United States Patent [19]
Brown

[11] Patent Number: 5,175,880
[45] Date of Patent: Dec. 29, 1992

[54] SIGNAL ANALYSIS

[75] Inventor: Ian D. Brown, Derby, England

[73] Assignee: Rolls-Royce plc, London, England

[21] Appl. No.: 896,911

[22] Filed: Jun. 11, 1992

Related U.S. Application Data

[63] Continuation of Ser. No. 429,377, Oct. 31, 1989, abandoned.

[30] Foreign Application Priority Data

Nov. 3, 1988 [GB] United Kingdom ................. 8825748

[51] Int. Cl.$^5$ ...................... H04B 17/00; G01R 23/16
[52] U.S. Cl. ................................. 455/226.1; 455/324; 324/77 R
[58] Field of Search ............... 455/226.1, 226.2, 226.3, 455/226.4, 67.1, 67.4, 324; 324/77 B, 77 R, 77 CS, 78 F

[56] References Cited

U.S. PATENT DOCUMENTS

| | | | |
|---|---|---|---|
| 3,634,760 | 1/1972 | Murtin et al. | 324/77 R |
| 4,253,066 | 2/1981 | Fisher et al. | 455/202 |
| 4,430,611 | 2/1984 | Boland | 324/77 B |
| 4,672,308 | 6/1987 | Leikus | 324/77 B |

FOREIGN PATENT DOCUMENTS

| | | |
|---|---|---|
| 56210347 | 7/1983 | Japan . |
| 2076548 | 5/1980 | United Kingdom . |

OTHER PUBLICATIONS

Hiscocks, "Audio Spectrum Analyser", vol. 86 (1980), pp. 55–60.

Primary Examiner—Reinhard J. Eisenzopf
Assistant Examiner—Lisa Charouel
Attorney, Agent, or Firm—Cushman, Darby & Cushman

[57] ABSTRACT

To analyse its spectrum, a radio signal is beat with an intermediate signal in a heterodyne circuit having a local oscillator sweeping a range of intermediate frequencies. The oscillator signal also beats with the output from a comb generator to produce signals marking intervals in its frequency sweep. The magnitude of the filtered intermediate frequency signal is measured between intervals marked by the frequency interval signals to output a frequency spectrum of the input signal. Preferably, the intermediate frequency signal is filtered in a homodyne demodulating unit employing a further local oscillator tuned to the intermediate frequency. A spectrum data display employs a memory storing the signal magnitudes at successive frequency steps at respective addresses associated with individual frequency steps. The magnitude values are assigned to their addresses by the spectrum frequency interval signals. For reading the stored data onto a two-dimensional magnitude: frequency display, control signals access the addresses and simultaneously step through the frequency dimension in the display. The signals read out from each address thereby generate magnitude values of the display which are located at their appropriate frequency positions by the control signals.

4 Claims, 3 Drawing Sheets

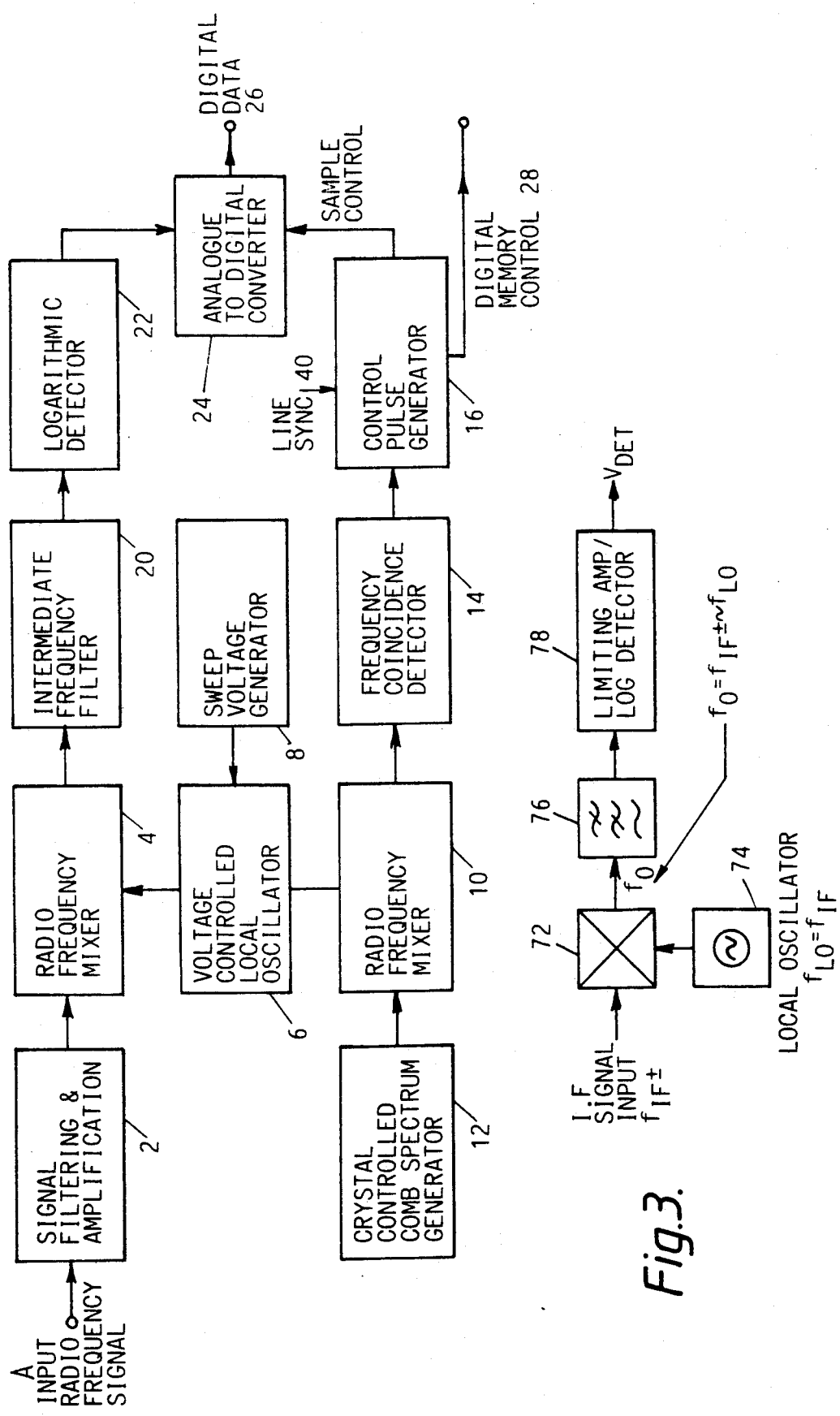

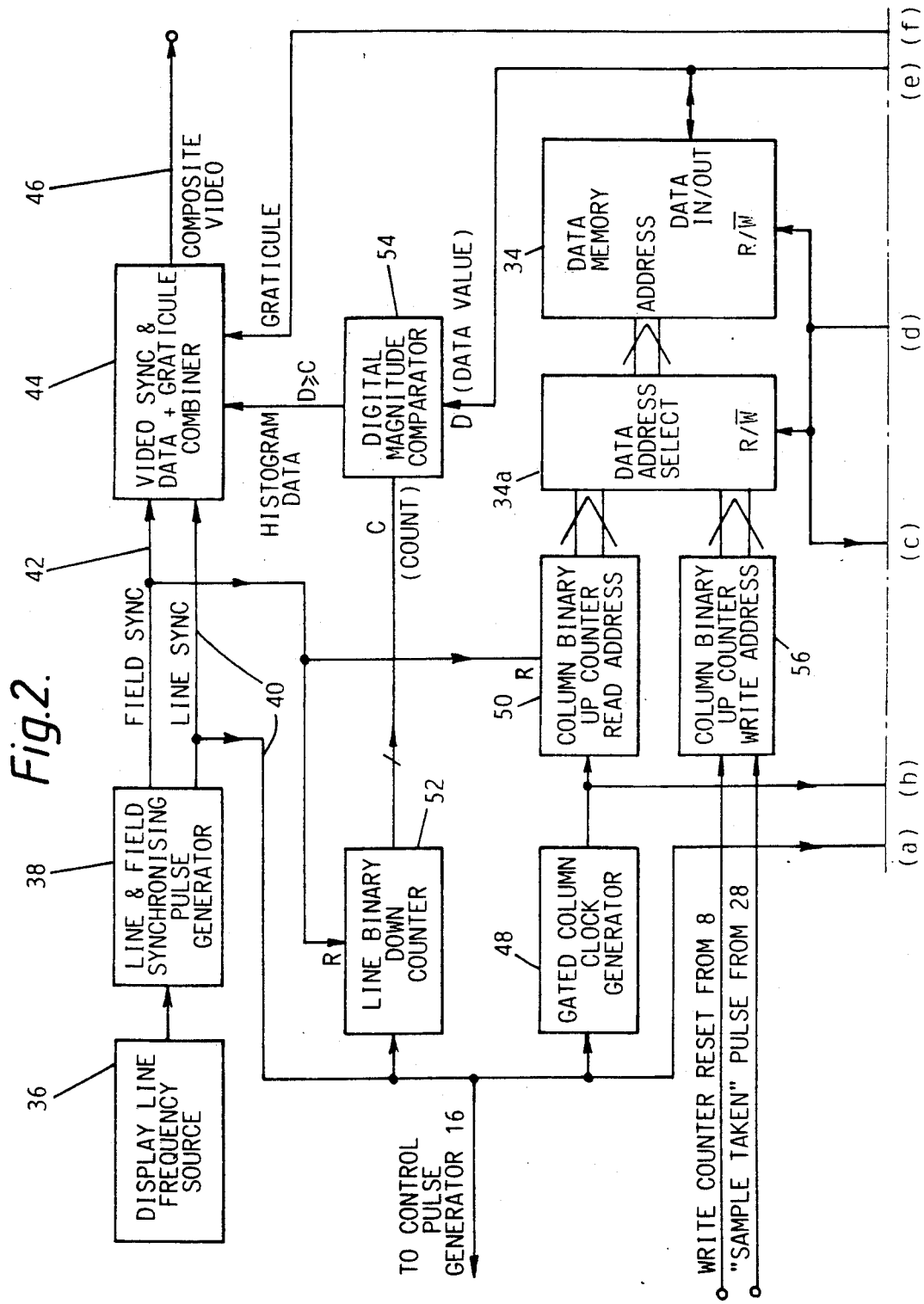

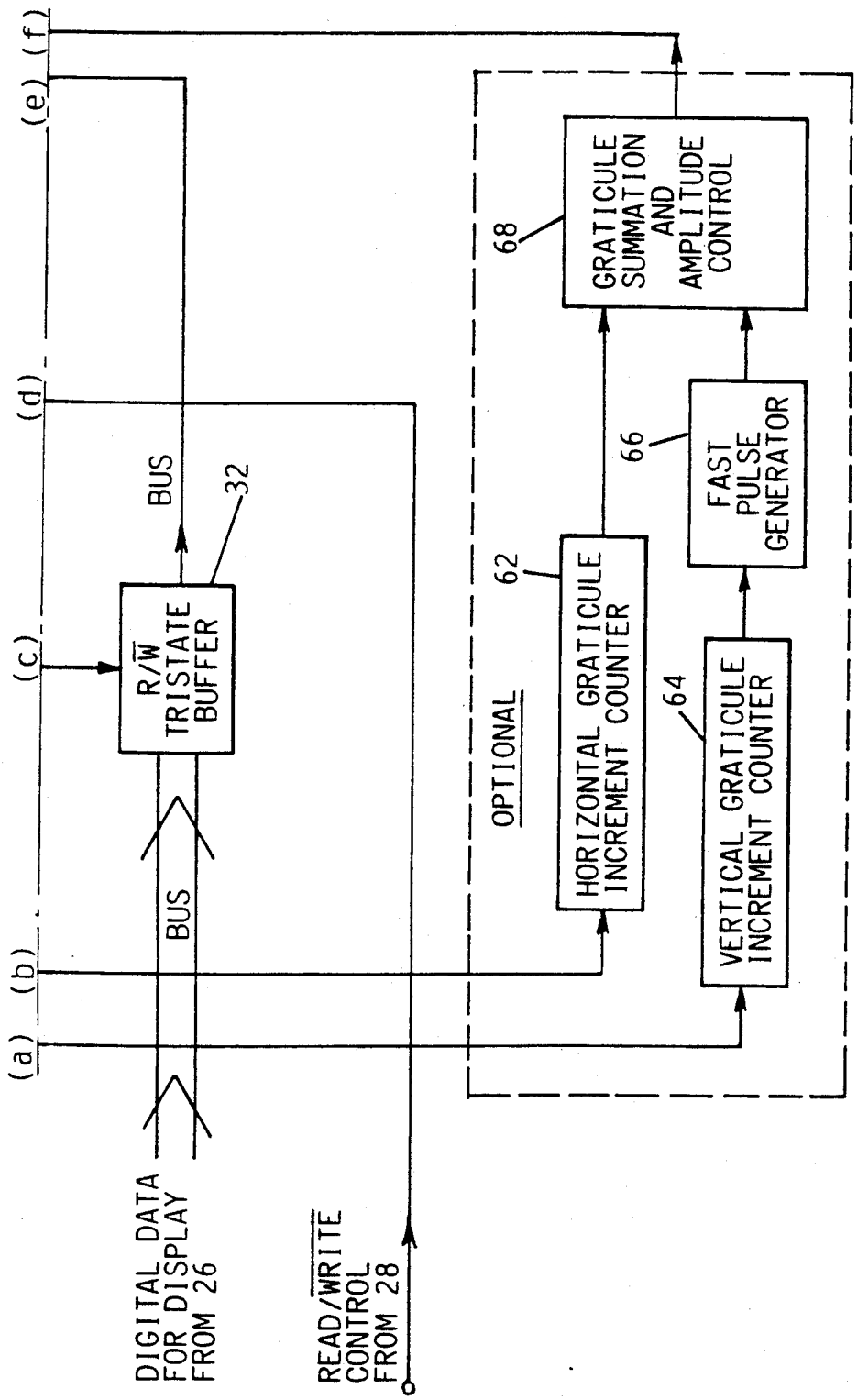

SIGNAL ANALYSIS

This is a continuation of application Ser. No. 07/429,377, filed on Oct. 31, 1989 which was abandoned upon the filing hereof.

This invention relates to the reception of magnetic signals, in particular radio signals, and the discrimination between specific frequency components of such signals, e.g., to analyse the frequency spectrum of a signal.

Analysis of the frequency components in a radio signal may be required for a wide variety of purposes, one example being in the use of radio transmitters in telemetry and communications. Spectrum analysers are known which record the signal amplitude with respect to frequency but they are complex instruments. In order to identify accurately the signal strengths at specific frequencies as the frequency spectrum is swept it is necessary to ensure that the amplitude measurements are matched to their correct frequencies. In practice this depends upon maintaining a linear voltage:frequency characteristic in a voltage controlled oscillator which is employed to tune selectively to a range of frequencies in the incoming signal. The linearity of the oscillator is difficult to maintain over a wide frequency range, such as the VHF/UHF range, and that leads to considerable complexity in the circuitry. In consequence of this, known spectrum analysers are bulky and relatively expensive.

In one of its aspects an object of the present invention is to provide a simpler form of frequency analyser.

According to this aspect of the invention, there is provided an electrical signal frequency analyser which comprises:

(i) means for reception of an input electrical signal comprising a plurality of different frequency components which are to be selectively detected, (ii) means for generating a progressively changing frequency signal, (iii) first mixing means for beating the input signal with said changing frequency signal, (iv) filter means for the mixed product of the input signal and said changing frequency signal to obtain from said mixed product signal the component within a predetermined range of frequencies, (v) signal strength detector means for evaluating the magnitude of the mixed and filtered signal component, (vi) means for outputting a series of spaced frequency signals, (vii) second mixing means for beating the spaced frequency signals with said changing frequency signal, (viii) detecting means for producing an output upon coincidence of the instantaneous frequency of said changing frequency signal with any of the specific frequencies of the spaced frequency signals, (ix) control means for producing from said detecting means output a series of control signals, and (x) means for outputting in accordance with said control signals the signal magnitudes evaluated in the signal strength detector means, whereby the output signal magnitudes represent a spectrum-divided sequence of components of the input electrical signal in frequency steps determined by said coincidence detecting means.

In another aspect of the invention, a novel form of intermediate frequency detection is provided that has particular application to a spectrum analyser for simplification of its circuitry, although its use is not necessarily limited thus. In accordance with this aspect of the invention, a signal detector stage for operating on an alternating frequency signal, such as the intermediate frequency from a heterodyne stage of a radio signal receiver, comprises: a frequency mixer having respective inputs from the alternating frequency signal and a predetermined frequency signal equal to the centre frequency of the alternating frequency signal, whereby the two inputs are beat together in substantially homodyne mode to produce a mixed output signal from the frequency mixer; a low pass filter for receiving the mixed output signal and passing a signal of limited bandwidth; and a signal strength detector for receiving the limited bandwidth signal and deriving therefrom a measure of the integrated signal level over a bandwidth equal to twice the limit of the cut-off frequency of the low pass filter. A further aspect of the invention is concerned with the display of spectral data, such as that given by frequency spectrum analysis. The manipulation of such data to put it in a convenient and easily understood form usually requires large data processing resources. For a raster scan display, data must be located in two dimensions, in effect placing the data in a two-dimensional memory map which can then be scanned by line and column counters to generate the display. It is an object of the present invention in a further one of its aspects to provide a data processing means that presents data such as spectral data in a two-dimensional form, that is relatively simple in construction and that can be economically manufactured as a compact device.

In this further aspect, the invention provides data processing means for processing a display of two-dimensional data values, comprising input means for reading the values in one dimension into a store through a series of addresses selected by the values in the other dimension, whereby said addresses correspond to values in said other dimension, and, for outputting the data values to a two-dimensional display means, there are provided read-out means for accessing said memory store addresses serially, and display actuating means arranged to operate in synchronism with the read-out means so as to scan said other dimension in the display, thereby to write into the display the values in said one dimension at their associated positions in said other dimension as they are accessed through the corresponding addresses in said store.

By way of example, the invention will be described in more detail with reference to the accompanying schematic drawings, in which:

FIG. 1 shows in block form a spectrum analysis circuit for a radio frequency signal, FIG. 2 shows in block form data processing means for producing a two-dimensional data display, in particular for use in conjunction with the circuit of FIG. 1, and FIG. 3 illustrates a signal detector that can be used in a modification of the circuit in FIG. 1.

In FIG. 1 there is illustrated in block form a circuit that receives a radio signal containing a spectrum of frequencies and that functions to provide output indicating the signal strength at specific frequency values. The circuit includes means for sweeping a frequency range and is thus able to extract the data for a frequency analysis of the incoming signal.

From an input A, the incoming signal is received in a filtering and amplification unit 2 which provides an amplified form of the signal in the frequency range under investigation. This is input into a radio frequency mixer 4 having a second input of predetermined frequency from a local oscillator 6. The units mentioned so far can be essentially of conventional form and, indeed, operate in the manner of known superheterodyne radio receiving circuits to provide an intermediate frequency signal by beating the radio frequency signal with that from the local oscillator.

In the present instance, however, the local oscillator 6 is a voltage-controlled unit and its output frequency is regulated by a sweep voltage generator 8, which may be simply a voltage ramp generator. The intermediate frequency signal output from the mixer 4 therefore corresponds to a range of input radio frequencies in dependence upon the change in the local oscillator frequency with the voltage ramp.

The local oscillator 6 has a further output to a second radio frequency mixer 10 and a crystal-controlled comb spectrum generator 12 provides a second signal to mix with this. The comb spectrum generator directly couples a pulsed signal, with a sharp spike waveform at intervals of, e.g. 1 MHz, into the mixer 10. Because of the waveform, each pulse appears as a mixture of the fundamental 1 MHz frequency and all its harmonics. If the frequency range of the local oscillator 6 under the control of the voltage ramp is, for example, some 1-1200 MHz, when beat with the comb spectrum generator pulses in the second mixer 10 a distinctive output will be obtained from the second mixer at each incremental 1 MHz value of the local oscillator frequency as that frequency coincides with a specific harmonic, or the fundamental, in the comb spectrum pulses. The second mixer 10 outputs to a frequency coincidence detector 14 which identifies these points of coincidence and a control pulse generator 16 is actuated accordingly. The control pulses from the generator 16 thereby mark each 1 MHz interval in the frequency sweep of the local oscillator 6.

In the circuit shown in FIG. 1 the output from the first radio frequency mixer 4 is filtered and amplified in an intermediate frequency filter 20 to obtain the associated tuned frequency signal component from the input signal and this is measured in a logarithmic detector 22. For convenience of processing, the detector signal is digitized in an analogue to digital converter 24 which is outputted and cleared with each control pulse from the generator 16. The outputs from the converter 24 are a series of digital words each giving the signal strength of a specific frequency increment counted off by the comb spectrum. A spectrum analysis may therefore be presented by using the converter outputs through 26 and the control pulses of the generator 16 through 28 as the co-ordinates of a two-dimensional read-out. If required for the purpose of the read-out, as in the example to be described with reference to FIG. 2, a synchronising pulse input 40 can be applied to the generator 16 to time the control pulses.

The incremental frequency values, it should be noted, are determined fundamentally by the crystal of the comb generator. The sub-division of the frequency spectrum thus occurs independently of the linearity or otherwise of the ramp from the sweep voltage generator. The reading of the converter 24 by the control pulses generated from the comb spectrum automatically identifies the detected signal strengths with their frequency in the spectrum scanned.

Many of the circuits indicated in FIG. 1 may themselves be of conventional form. The frequency coincidence detector 14 and the logarithmic detector 22 can employ SL6652 or SL6654 IC's from Plessey Semiconductors and the comb spectrum generator 12 can employ an MSF-8685 IC from Avantek.

The apparatus of FIG. 1 may be employed for the analysis of many different types of radio frequency signals for a great variety of purposes. The monitoring of radio instrumentation is one example; others are the analysis of television and radio signals, the detection of interference signals and the measurement of circuit and aerial parameters, including the orientation of aerials.

The spectrum analysis data can be processed and presented in a variety of ways, depending on the purpose for which it has been produced. As one example, use is made of the display data processor illustrated in FIG. 2 by means of which the data is displayed in the form of a histogram on a video screen.

In FIG. 2, the circuit has a data input from 26 (FIG. 1) for the digital magnitudes of the individual columns of the histogram display and a control input from 28 (FIG. 1) for a control signal for assigning the digital magnitudes to their respective columns. The data inputs, which may consist of a series of 8-bit words, are input to a read-write buffer 32. The buffered data is read from the buffer and written into a data memory 34 by the control signal pulses from 28 which also operate on an address select 34a for the memory so as to assign each data word to a specific column address in the memory.

The circuit also comprises a frequency source 36 which actuates a line and field synchronising pulse generator 38 for the display screen (not shown). The pulse generator has outputs 40,42 for a stream of line synchronisation pulses rastering the display screen and for field synchronisation pulses recycling the raster. These pulses control a video synchroniser 44 by means of which composite video signals are transmitted through line 46 to a standard video input. Alternatively, by use of a video modulator the data may be presented to a standard television receiver antenna input for display.

The line synchronisation pulses are also input to a gated column clock generator 48, which scans a first column up counter 50 with succeeding line pulses, and to a line down counter 52. The column up counter 50 forms a read address counter and is connected to the address select 34a of the data memory 34 to scan the column addresses in the memory. As a result, the memory outputs in sequence, to a digital magnitude comparator 54, the data words read into those addresses from the buffer 32 for the successive columns of the display.

The line down counter 52 under the control of the line synchronisation pulses also outputs to the comparator 54 which then provides an output whenever the column magnitude value is equal to or greater than the line countdown value. While the line down counter indicates a row of the display, the addresses of the data memory are scanned by the column up counter and an output signal is produced by the comparator at each point on that row of the grid at which the data magnitude for a specific column is equal to or greater than the row value indicated by the line counter. The scan is repeated as the counter 52 counts down the lines of the display, the field synchronisation line providing a resetting pulse for the two counters 50,52 at the end of a raster.

The scan of each line will therefore provide video outputs for those points along the line at which the column magnitude is at least equal to the line countdown value. In each column, once the magnitude value matches the count-down value, all lower line values will also be illuminated as the line scan continues down the screen. The raster thus presents the data input in the form of a histogram. It is similarly possible to produce the histogram in a negative form by illuminating higher line values instead of lower values.

It is significant to note that although the data is presented on the screen in two-dimensional form, the data memory need hold only a series of data words representing single-dimension data magnitudes. Accordingly it can be a very much smaller and simpler unit than a store that is required to hold data for each of the grid of pixels that occupy the area of the display screen.

Successive frequency strength signals are generated at a substantially lower rate than are the line synchronisation pulses. The address select 34a is normally held in the read mode from which it is switched only when new data appears from the A-D convertor 24. The new data is received by the buffer 32 and can be written into the memory 34 during intervals between data read outputs. Because the scan display area has a line length smaller than the line scan of the video signal, write periods are available between successive line scans and can be initiated by the line synchronisation pulses.

For this purpose a second column-up counter 56 functions as a write address counter; it is incremented by a "sample taken" pulse from line 28 from the control pulse generator 16. The pulse is outputted from the generator 16 after the reading of a data sample into the buffer 32 is completed, when the next line synchronisation pulse appears from the synchronising pulse generator 38. Accordingly, on each line synchronisation pulse, the control pulse on line 28 operates the address select 34a to select the write address given by the incremented counter 56 and also sets the memory 34 to the write mode to receive the data value from the buffer 32 at the selected write address. On completion of the writing operation, the system returns again to the read mode for the data display.

At the end of the column scan by the write address counter 56, a reset pulse sets the counter to zero for the beginning of a further up-count. The reset pulse in this example may come for instance from the sweep voltage generator 8.

Although the apparatus has been described as giving a histogram display, it will be understood that the single-dimensional memory can also be employed for other forms of display—e.g. a line graph would be produced if an output signal was produced only when the magnitude value was coincident with the line countdown value. The display screen itself can of course take a variety of forms; for a hand-portable form of the apparatus, for example, it may be appropriate to use a liquid crystal display unit such as are currently available commercially.

FIG. 2 also shows, as an optional addition, means for generating a graticule on the display screen to facilitate reading the data display. For this purpose the pulses of the column clock generator 48 can be employed directly to drive a horizontal graticule increment counter 62 which generates horizontally spaced lines of the graticule at intervals determined by the counter 62. The line synchronisation pulses from the line 40 are inputted to a vertical graticule increment counter 64 to actuate a fast pulse generator 66 at intervals determined by the counter 64, the generator output on each countdown generating a vertically spaced line of the screen. The actuating signals from the horizontal increment counter 62 and the vertical increment pulse generator 66 are taken through a graticule summation and amplitude control 68 to the video synchroniser 44 where they are combined with the video data display.

It will be understood that although the display data processor of FIG. 2 has been described in conjunction with the frequency spectrum analysing circuit of FIG. 1, it can be applied to the display of any type of data that can be read into the memory 34 in the manner described and can be used to generate the display in the manner of a histogram or line chart or any other two-dimensional display on a raster scan display device.

It should be understood that a modified version of the display data processor within the invention could be produced which would embody the same basic principle of comparison of memory contents with a screen line downcount to produce video data, but would realise it by implimenting the pixel/line/write counting, timing signal control and memory address selection logic in an electrically programable logic device (EPLD) instead of utilising discrete components, the device being driven from an external high speed clock. As part of a spectrum analyser, its control logic would preferably include an equivalent to the control pulse generator 16 of FIG. 1, which the device would replace. Horizontal and vertical graticule drives could also easily be implimented in the device.

In the circuit of FIG. 1, the desired signal is filtered from the output of the radio frequency mixer 4 by the intermediate frequency bandwidth filter 20 for input to the logarithmic detector 22. Such a configuration may demand circuitry of a high technical specification: if a 1 MHz bandwidth is to be selected from an intermediate frequency of 50 MHz, a filter 20 with a Q of 50 is required, and complex circuitry is required to give the logarithmic detector sufficient dynamic range at that intermediate frequency.

FIG. 3 shows a preferred alternative to such a filter, comprising a further radio frequency mixer 72, local oscillator 74 and low pass filter 76, which gives an output to a logarithmic detector 78 designed for substantially lower frequencies than the logarithmic detector 22 in FIG. 1. Thus elements 72, 74 and 76 are used as an intermediate frequency filter to replace filter 20 in FIG. 1 and detector 78 also replaces detector 22. In this way it is possible to perform the required filtering in a way that is simpler and more economical overall than if a standard fast roll-off L-C or quartz crystal filter is used.

The three circuits 72,74,76 may be formed by sections of an SL6652 or SL6654 IC from Plessey Semiconductors. For an equivalent discrimination at the 50 MHz intermediate frequency referred to above, the low pass filter 76 would have an upper cut-off frequency limit of 500 KHz. The local oscillator 74 is operated at the centre frequency of the intermediate frequency signal from the first radio frequency mixer 4 so that two signals of similar frequency are input to the radio frequency mixer of FIG. 3, which thereby acts as a homodyne demodulator. Such a unit can be regarded as a form of superheterodyne demodulator with an intermediate frequency extending down to low or zero frequency. In these conditions, the 1 MHz bandwidth signal to be detected in the second radio frequency mixer output is now in the frequency range ±500 KHz, i.e. the filter frequency response range above the local oscillator frequency and the mirror image of that range.

In a state of precise synchronism there is of course no AC output from the second mixer 72 but in practice this effect is smoothed by the limits of discrimination in the circuitry. Although an analysis of the filter output would show some drop in response at zero frequency, this effect would be swamped by the response over the filter band unless an excessively low maximum pass frequency were set.

For efficient operation of the circuit of FIG. 3, the input signal requires to be band-limited to ensure the suppression of frequencies that are harmonics of the frequency of the local oscillator 74, but the oscillator can be swept over almost an octave subject to that condition. A tuneable radio frequency logarithmic detector circuit such as that shown in FIG. 3 can be used, however, for other purposes than a spectrum analyser if the required range of the local oscillator is not too great.

I claim:

1. An electrical signal frequency analyser comprising:
   (i) means for reception of an input electrical signal comprising a plurality of different frequency components which are to be selectively detected,
   (ii) means for generating a progressively changing frequency signal,
   (iii) first mixing means for beating the input signal with said progressively changing frequency signal,
   (iv) filter means for a mixed product of the input signal and said progressively changing frequency signal to obtain from said mixed product signal the component within a predetermined range of frequencies,
   (v) signal strength detector means for evaluating the magnitude of a mixed filter signal component,
   (vi) means for inputting a series of spaced frequency signals,
   (vii) second mixing means for beating the spaced frequency signals with said progressively changing frequency signal,
   (viii) coincidence detecting means for producing an output upon a coincidence of the instantaneous frequency of said progressively changing frequency signal with any of the specific frequencies of said spaced frequency signals,
   (ix) control means for producing, from said coincidence detecting means output, a series of control signals, and
   (x) means for outputting, in accordance with said control signals, signal magnitudes evaluated in the signal strength detector means, whereby the signal magnitudes represent a spectrum-divided sequence of components of the input electrical signal in frequency steps determined by said coincidence detecting means.

2. An analyser according to claim 1 in which an output frequency of the generating means for said progressively changing frequency signal is regulated by a sweep voltage generator.

3. An analyser according to claim 2 in which the sweep voltage generator is a ramp generator.

4. An analyser according to claim 1 in which for outputting said series of spaced frequency signals, means are provided to generate a comb spectrum and to produce pulses from the spectrum containing a fundamental comb spectrum frequency and a series of harmonics thereof at spaced frequencies.

* * * * *